(12) United States Patent
Ding et al.

(10) Patent No.: US 12,075,562 B2
(45) Date of Patent: Aug. 27, 2024

(54) MOTHERBOARD WITH SHOCKPROOF, SHAKEPROOF AND WATERPROOF FUNCTIONS, ELECTRONIC DEVICE AND WATERPROOF PREPARATION METHOD

(71) Applicant: SHENZHEN WEIBU INFORMATION CO., LTD., Guangdong (CN)

(72) Inventors: Yongbo Ding, Guangdong (CN); Jianxin Huang, Guangdong (CN); Shengguang Wu, Guangdong (CN)

(73) Assignee: SHENZHEN WEIBU INFORMATION CO., LTD., Guangdong (CN)

( * ) Notice: Subject to any disclaimer, the term of this patent is extended or adjusted under 35 U.S.C. 154(b) by 0 days.

(21) Appl. No.: 17/784,180

(22) PCT Filed: Aug. 25, 2020

(86) PCT No.: PCT/CN2020/111010
§ 371 (c)(1),
(2) Date: Jun. 10, 2022

(87) PCT Pub. No.: WO2022/032722
PCT Pub. Date: Feb. 17, 2022

(65) Prior Publication Data
US 2023/0023188 A1    Jan. 26, 2023

(30) Foreign Application Priority Data
Aug. 13, 2020  (CN) .................. 202010810186.2

(51) Int. Cl.
*H05K 1/02*      (2006.01)
*B05D 1/18*      (2006.01)
*B05D 5/00*      (2006.01)
*H05K 3/28*      (2006.01)
*H05K 7/10*      (2006.01)
*H05K 7/14*      (2006.01)

(52) U.S. Cl.
CPC ............. *H05K 1/0271* (2013.01); *B05D 1/18* (2013.01); *B05D 5/00* (2013.01); *H05K 3/28* (2013.01); *H05K 7/10* (2013.01); *H05K 7/1407* (2013.01)

(58) Field of Classification Search
CPC .......... H05K 1/02; H05K 1/0271; H05K 3/28; H05K 7/10; B05D 1/18; B05D 5/00
USPC ....................................................... 174/255
See application file for complete search history.

(56) References Cited

U.S. PATENT DOCUMENTS

2018/0255162 A1*  9/2018  Nam ..................... G06F 1/1652

* cited by examiner

*Primary Examiner* — Tremesha S Willis
(74) *Attorney, Agent, or Firm* — Jose Cherson Weissbrot

(57) ABSTRACT

A motherboard with shockproof, shakeproof and waterproof functions is installed in a cabinet of an electronic device, the motherboard includes a PCB board, wherein front surface of the PCB board is provided with a plurality of structural members, a camera seat unit, an audio seat unit, a functional seat unit, a holder seat and a battery seat with shockproof and shakeproof functions; wherein each of the structural members is dispersedly fixed on a side of the PCB board, wherein the structural member screws and fixes the PCB board inside the cabinet, and wherein each of the seats and the PCB board are coated with waterproof coating.

9 Claims, 2 Drawing Sheets

MOTHERBOARD WITH SHOCKPROOF, SHAKEPROOF AND WATERPROOF FUNCTIONS, ELECTRONIC DEVICE AND WATERPROOF PREPARATION METHOD

TECHNICAL FIELD

The present disclosure relates to the technical field of electronics, in particular to a motherboard with shockproof, shakeproof and waterproof functions, an electronic device and a waterproof preparation method.

BACKGROUND

The mainboards of the existing electronic device are typically coated with waterproof, dampproof and dustproof paint to achieve waterproof, dampproof and dustproof functions, to prolong the service life of the mainboard and ensure safety. However, electronic devices are tested under difference circumstances. For example, educational tablet computers drop or fall easily because they are usually used by children, thus require motherboards with shockproof and shakeproof functions. If the motherboard is not firmly fixed on the cabinet of the electronic device, and the signal connection firmness of each interface can be affected if the motherboard is shifted or even falls off. The components on the motherboard can be damaged, thus affecting the functionality of the electronic device.

In addition, the existing coating process uses brushes or spray cans manually, creating the problem of uneven coating. The gaps between components are not easily coated, and manual coating is a difficult task.

SUMMARY

Aiming at the above technical problems, the embodiment of the present disclosure provides a motherboard with shockproof, shakeproof and waterproof functions, an electronic device and a waterproof preparation method, to solve the problem that the existing motherboard has no shockproof and shakeproof functions.

The embodiment of the present disclosure provides a motherboard with shockproof, shakeproof and waterproof functions, which is installed in the cabinet of an electronic device, wherein the motherboard comprises a PCB board, the front surface of the PCB board is provided with a plurality of structural members, a camera seat unit, an audio seat unit, a functional seat unit, a holder seat and a battery seat with shockproof and shakeproof functions;

each of the structural members is dispersedly fixed on the side of the PCB board, the structural member screws and fixes the PCB board inside the cabinet, and each of the seats and the PCB board are coated with waterproof coating.

Preferably, in the motherboard with shockproof, shakeproof and waterproof functions, the structural member comprises a steel sheet and two supporting sheets for supporting the steel sheet, one end of the two supporting sheets is correspondingly fixed on both sides of the bottom of the steel sheet, the other end of the two supporting sheets is provided with protruding feet, the PCB board is provided with slots corresponding to the protruding feet, and the protruding feet of the two supporting sheets are inserted into the corresponding slots and welded to the PCB board;

the middle of the steel sheet is provided with a first screw hole, the PCB board is provided with a second screw hole aligned with the first screw hole, the inner side of the cabinet is provided with a third screw hole aligned with the first screw hole, and screws pass through the first screw hole and the second screw hole in sequence and are screwed into the third screw hole inside the cabinet for screwing and fixing.

Preferably, in the motherboard with shockproof, shakeproof and waterproof functions, the side of the PCB board is further provided with a plurality of clamping slots, the inner side of the cabinet is provided with clamping posts at the position corresponding to the clamping slots, and the clamping slots are clamped on the clamping posts.

Preferably, in the motherboard with shockproof, shakeproof and waterproof functions, the camera unit comprises a front camera seat and a rear camera seat, the front camera seat is provided at the lower left corner of the PCB board, and the rear camera seat is provided at the left side of the PCB board; and the middle of the upper side of the PCB board is provided with a groove for accommodating a camera.

Preferably, in the motherboard with shockproof, shakeproof and waterproof functions, the audio seat unit comprises a first speaker seat, a second speaker seat, a third speaker seat, a fourth speaker seat, a main microphone seat and an auxiliary microphone seat; the first speaker seat, the second speaker seat, the main microphone seat and the auxiliary microphone seat are provided on the left side of the PCB board; the third speaker seat and the fourth speaker seat are provided on the right side of the PCB board.

Preferably, in the motherboard with shockproof, shakeproof and waterproof functions, the functional seat unit comprises a USB interface for connecting a USB device, a key seat for connecting function keys, an electromagnetic screen seat for connecting an electromagnetic screen, a screen seat for connecting a display screen, a keyboard seat for connecting a keyboard externally, and an antenna seat for connecting an antenna;

the USB interface is provided on the right side of the groove, the key seat is provided on the left side of the PCB board, and the electromagnetic screen seat, the screen seat and the keyboard seat are provided on the lower side of the PCB board; the antenna seat is provided on the left side of the PCB board.

Preferably, the motherboard with shockproof, shakeproof and waterproof functions further comprises a reinforcing bracket, wherein the reinforcing bracket covers the upper side and the left and right sides of the USB interface, the left and right sides of the reinforcing bracket are provided with a structural member, respectively, supporting legs on the left and right sides of the reinforcing bracket are welded to the PCB board, and the sides of the supporting legs are connected with the steel sheets corresponding to the structural members.

Preferably, in the motherboard with shockproof, shakeproof and waterproof functions, the holder seat is provided at the upper right end of the PCB board, and the left and right sides of the holder seat are provided with a structural member, respectively; and the battery seat is a horizontal interface of a patch 5PIN.

The second aspect of the embodiment of the present disclosure provides an electronic device, which comprises a cabinet, wherein the motherboard with shockproof, shakeproof and waterproof functions is installed in the cabinet.

The third aspect of the embodiment of the present disclosure provides a waterproof preparation method using the motherboard with shockproof, shakeproof and waterproof functions, comprising:

Step A, performing functional test on the installed motherboard;

Step B, soaking the motherboard in the waterproof nanosolution, and taking the motherboard out for drying treatment and functional test after a first preset time;

Step C, soaking the motherboard in purified water, taking the motherboard out for drying treatment and functional test after a second preset time.

According to the technical solution provided by the embodiment of the present disclosure, the motherboard is installed in the cabinet of the electronic device, and comprises a PCB board, wherein the front surface of the PCB board is provided with a plurality of structural members, a camera seat unit, an audio seat unit, a functional seat unit, a holder seat and a battery seat with shockproof and shakeproof functions; each of the structural members is dispersedly fixed on the side of the PCB board, the structural member screws and fixes the PCB board inside the cabinet, and each of the seats and the PCB board are coated with waterproof coating. Because the PCB board is directly screwed and fixed inside the cabinet through the structural members, and the structural members are dispersed on the sides of the PCB board, the PCB board can be fixed from different directions, and the screw connection is firmer, so that the motherboard can be prevented from shifting or falling off when the electronic device drops, the connection between each of the seats on the PCB board and other interfaces can be prevented from loosening, and the problem that the existing motherboard has no shockproof and shakeproof functions is solved. At the same time, the shockproof, shakeproof and waterproof functions can be realized in combination with the waterproof effect of the waterproof coating.

DETAILED DESCRIPTION OF THE EMBODIMENTS

The technical solutions in the embodiments of the present disclosure will be clearly and completely described with reference to the drawings in the embodiments of the present disclosure hereinafter. Obviously, the described embodiments are merely part of the embodiments of the present disclosure, rather than all of the embodiments. According to the embodiments of the present disclosure, all other embodiments obtained by those skilled in the art without creative labor belong to the scope of protection of the present disclosure.

Figure 1:
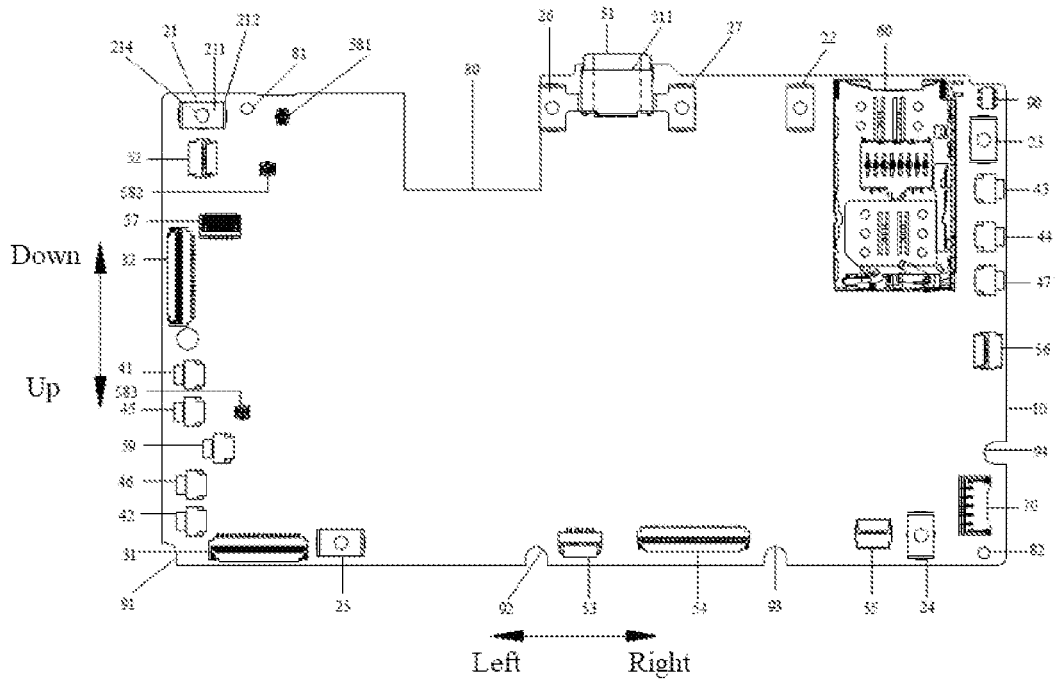
FIG. 1 is a schematic diagram of the front surface of a motherboard with shockproof, shakeproof and waterproof functions according to an embodiment of the present disclosure.

Referring to FIG. 1, an embodiment of the present disclosure provides an electronic device. A motherboard with shockproof, shakeproof and waterproof functions is installed in the cabinet of an electronic device. The motherboard comprises a PCB board 10. The front surface of the PCB board 10 is provided (welded) with a plurality of structural members, a camera seat unit, an audio seat unit, a functional seat unit, a holder seat 60 and a battery seat 70 with shockproof and shakeproof functions; each of the structural members is dispersedly fixed on the side of the PCB board 10, the structural member screws and fixes the PCB board 10 inside the cabinet of the electronic device, and each of the seats and the PCB board 10 are coated with waterproof coating. Because the PCB board 10 is directly screwed and fixed inside the cabinet through the structural members, and the structural members are dispersed on the sides of the PCB board 10, the PCB board 10 can be fixed from different directions, and the screw connection is firmer, so that the motherboard can be prevented from shifting or falling off when the electronic device drops, the connection between each of the seats on the PCB board 10 and other interfaces can be prevented from loosening, and the problem that the existing motherboard has no shockproof and shakeproof functions is solved. At the same time, the shockproof, shakeproof and waterproof functions can be realized in combination with the waterproof effect of the waterproof coating.

It should be understood that various functional circuits (such as a signal processing circuit, a communication circuit, a power supply circuit, etc.) and their corresponding components must also be provided on the PCB board 10, which are related to the functions of the electronic device. This is the prior art, which is not limited here. In this embodiment, waterproof coating is mainly used to realize the waterproof function, and structural members and clamping slots are used to realize the shockproof and shakeproof functions. By limiting the size of each seat and the PCB board, the motherboard can meet the requirements of thinning. The details are as follows.

Figure 2:
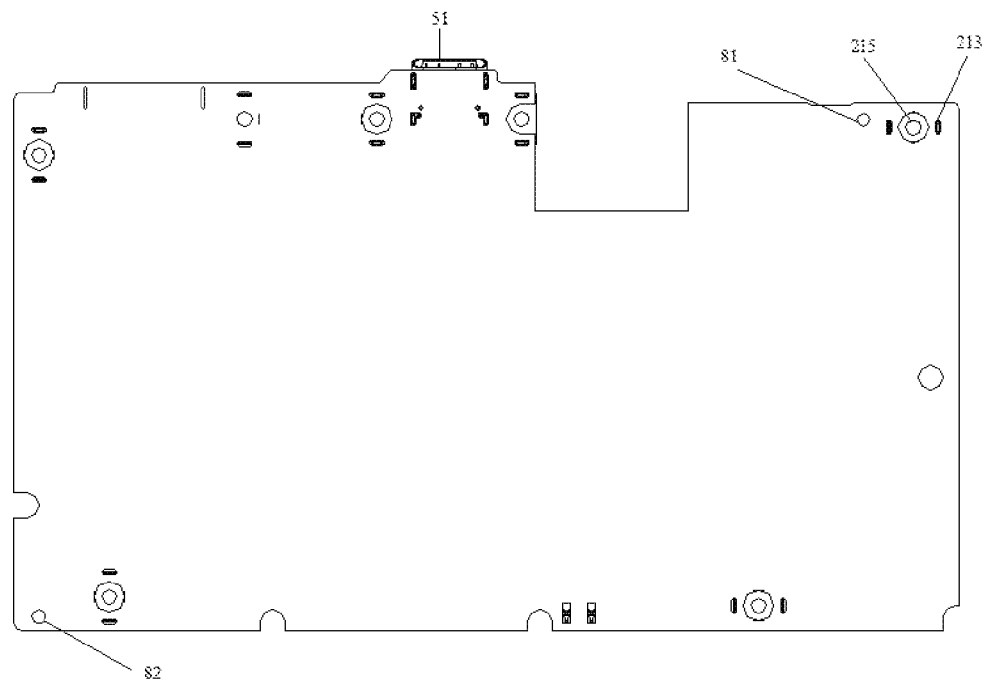
FIG. 2 is a schematic diagram of the back surface of a motherboard with shockproof, shakeproof and waterproof functions according to the embodiment of the present disclosure.

Referring to FIG. 2, in this embodiment, the structure comprises a rectangular steel sheet 211 and two supporting sheets 212 for supporting the steel sheet 211. One end of the two supporting sheets 212 is correspondingly fixed on both sides of the bottom of the steel sheet 211, and the other end of the two supporting sheets is provided with protruding feet. The PCB board is provided with slots 213 corresponding to the two protruding feet, and the protruding feet of the two supporting sheets 212 are inserted into the corresponding slots 213 and welded to the PCB board 10. The middle of the steel sheet 211 is provided with a first screw hole 214, the PCB board 10 is provided with a second screw hole 215 aligned with the first screw hole 214, the inner side of the cabinet is provided with a third screw hole aligned with the first screw hole 214, and screws pass through the first screw hole 214 and the second screw hole in sequence and are screwed into the third screw hole inside the cabinet for screwing and fixing. In this embodiment, the screw holes on the steel sheet are collectively referred to as the first screw holes, the screw holes aligned with the first screw holes on the PCB board 10 are collectively referred to as the second screw holes, and the screw holes aligned with the first screw holes inside the cabinet are collectively referred to as the third screw holes. The numbers of the first screw holes, the second screw holes and the third screw holes are corresponding to each other. By providing the protruding feet, the convex part at the other end of the supporting sheet (i.e. the protruding feet) is inserted into the slot, and the part on the other end of the supporting sheet beside the protruding feet abuts against the PCB board, so that the fixing can be strengthened by inserting the PCB board, and the abutting part can prevent the supporting sheet from extending out of the back surface of the PCB board too much to occupy the space of the back surface.

Preferably, there are five structural members, including a first structural member 21 fixed at the upper left corner of the PCB board 10, a second structural member 22 fixed at one side (such as the left side) of the holder seat 60, a third structural member 23 fixed at the upper right corner of the PCB board 10, a fourth structural member 24 fixed at the lower right corner of the PCB board 10 and a fifth structural member 25 fixed at the lower left corner of the PCB board 10. As the four structural members are located at the four corners of the PCB board 10, the stability of the PCB board can be basically ensured, and the structural members are hollow. When fixed by screws, the hollow part can play a buffering role when falling, further improving the shock-proof effect.

It should be understood that the specific position of the structural member can be adjusted according to the position requirements of other seats, but the position is preferably near the four corners of the PCB board 10. The number of the structural members can also be increased according to the requirements of a seat.

In order to facilitate the PCB board 10 to be installed inside the cabinet, the PCB board 10 is further provided with positioning holes (81, 82), such as two positioning holes, which are provided at the upper left corner and the lower right corner of the PCB board 10, respectively. Positioning posts are correspondingly provided at the positions aligned with the positioning holes inside the cabinet, and the positioning posts are inserted into the positioning holes to position the PCB board 10.

In order to further prevent the PCB board 10 from shifting when the PCB board falls, the side of the PCB board 10 is further provided with a plurality of clamping slots. In this embodiment, the bottom left corner of the PCB board 10 is directly provided with a first clamping slot 91 in the circular and concave shape, a second clamping slot 92 (located on the left side of the electromagnetic screen seat 53) and a third clamping slot 93 (located on the right side of the screen seat 54) which are in the semi-circular and concave shape are all located on the lower side of the PCB board 10, and a fourth clamping slot 94 (located on the upper side of the battery seat 70) in the semi-circular and concave shape is provided on the right side of the PCB board 10. The inner side of the cabinet is provided with clamping posts at the position corresponding to the clamping slots, which are also referred to as clamping positions. When installing the PCB board, the clamping slots are aligned with the clamping posts and are clamped into the clamping posts. Through the groove design, the PCB board can be more accurately connected with the cabinet, so that the PCB board can be more firmly clamped at the designated position, and further prevent the PCB board from moving, falling off and even resulting in component damage after vibration. It should be understood that the number, shape and position of the clamping slots can also be set at other places on the PCB board according to the requirements, which are not limited here, as long as they are helpful for clamping and positioning.

In this embodiment, the electronic device takes an educational tablet computer as an example, and its camera is preferably set in the middle of the display screen to facilitate interactive shooting by users. The middle (inclined left) of the upper side of the PCB board 10 is provided with a groove 80 for accommodating a camera. The camera unit comprises a front camera seat 31 and a rear camera seat 32. The front camera seat 31 is preferably provided at the lower left corner of the PCB board 10, and the fifth structural member 25 is adjacent to the right side of the front camera seat 31. The rear camera seat 32 is preferably provided on the left side of the PCB board 10. The front camera seat 31 and the rear camera seat 32 support 24PIN to 51PIN, that is, the PIN number of the front camera seat 31 and the rear camera seat 32 can be any one of 24PIN to 51PIN, and the corresponding model can be selected according to the requirements to meet the requirement of the PIN number of the camera seat. In the specific implementation, the PIN number can also be other values, which are not limited here.

In this embodiment, the audio seat unit comprises four speaker seats (the specification is preferably 8 Ohm 1 W) and two microphone seats, namely, a first speaker seat 41 (connecting the upper right speaker), a second speaker seat 42 (connecting the upper left speaker), a third speaker seat 43 (connecting the lower right speaker), a fourth speaker seat 44 (connecting the lower left speaker), a main microphone seat 45 and an auxiliary microphone seat 46. The first speaker seat 41, the second speaker seat 42, the main microphone seat 45 and the auxiliary microphone seat 46 are provided on the left side of the PCB board 10. For example, the first speaker seat 41 is located on the lower side of the rear camera seat 32, the second speaker seat 42 is located on the upper side of the front camera seat 31, the main microphone seat 45 is located on the lower side of the first speaker seat 41, and the auxiliary microphone seat 46 is located on the upper side of the second speaker seat 42. The third speaker seat 43 and the fourth speaker seat 44 are provided on the right side of the PCB board 10. For example, the third speaker seat 43 is located on the lower side of the third structural member 23 and the right side of the holder seat 60, and the fourth speaker seat 44 is located on the lower side of the third speaker seat 43 and the right side of the holder seat 60. The stereo sound can be realized by connecting four speaker seats with four speakers, which can provide a better sound effect compared with the existing common one speaker or two speakers. Two microphones are provided to be connected with two microphones to acquire the voice of a user, and the noise is removed in combination with the algorithm in the internal circuit (such as blind source separation algorithm) to make the recording effect clearer.

Preferably, an auxiliary microphone seat can be reserved on the PCB board, that is, the reserved auxiliary microphone seat 47 provided at the lower side of the fourth speaker seat 44. The acquired voice signal can be used to reduce noise, so as to further improve the interactive conversation and recording effects.

In this embodiment, the functional seat unit comprises, but is not limited to, a USB interface 51 for connecting a USB device, a key seat 52 for connecting function keys, an electromagnetic screen seat 53 for connecting an electromagnetic screen, a screen seat 54 for connecting a display screen, and a keyboard seat 55 (such as a DOCK seat) for connecting a keyboard externally. The USB interface 51 is provided on the right side of the groove 80, the key seat 52 is provided on the left side of the PCB board 10 (preferably on the lower side of the first structural member 21), the electromagnetic screen seat 53 is provided on the lower side of the PCB board 10 (preferably in the middle of the lower side), the screen seat 54 is provided on the lower side of the PCB board 10 (preferably on the right side of the electromagnetic screen seat 53), and the keyboard seat 55 is provided on the lower side of the PCB board 10 (preferably on the left side of the fourth structural member). The screen seat 54 supports any PIN number between 24PIN and 60PIN, that is, the corresponding model is selected according to the requirements. The PIN number is any one between 24PIN and 60PIN, and the PIN numbers of different models are different. In the specific implementation, the PIN number can also be other values, which are not limited here.

The USB interface 51 can use TYPE_C interface or MIC_USB interface. Because the USB interface 51 is used frequently, in order to reinforce the USB interface, a reinforcing bracket 511 reinforced by the reinforced steel sheet is provided to cover the upper side and the left and right sides of the USB interface 51. The sixth structural member 26 and the seventh structural member 27 are provided on the left and right sides of the reinforcing bracket 511, respectively. The supporting legs on the left and right sides of the reinforcing bracket 511 are welded to the PCB board 10, and the sides of the supporting legs are correspondingly connected with the steel sheets of the sixth structural member 26 and the seventh structural member 27. The PCB board and the inside of the cabinet are correspondingly provided with a second screw hole and a third screw hole which are aligned with the first screw holes on the steel sheets of the sixth structural member 26 and the seventh structural member 27. The reinforcing bracket 511 is integrally connected with the sixth structural member 26 and the seventh structural member 27, and the shockproof and shakeproof performance of the PCB board is further improved by fastening through screws. The reinforcing bracket 511 reinforces the USB interface 51 with steel sheets to prevent shock. Through the test, after 10,000 times of plugging and unplugging, there are no problems such as falling off, warping and deformation that affect the function. During the thrust test, the USB interface 51 is tested on the machine with a thrust meter with a force of 10 kg, and there is no phenomenon of falling off.

The function keys connected to the key seat 52 include on-off key and volume up-down key. A handwriting pen slides on the electromagnetic screen, and the corresponding handwriting operation is input through the electromagnetic screen seat 53. Preferably, the functional seat unit further comprises a TP seat 56 connected to the touch screen and a fingerprint identification seat 57 connected to the fingerprint identification module. The TP seat 56 is provided on the right side of the PCB board 10 (preferably at the lower side of the reserved auxiliary microphone seat 47), and the fingerprint identification seat 57 is provided on the left side of the PCB board 10 (preferably adjacent to the upper right corner of the rear camera seat 32).

The key seat 52, the electromagnetic screen seat 53, the keyboard seat 55, the TP seat 56 and the fingerprint identification seat 57 support any PIN number between 4PIN and 12PIN. The corresponding model of these seats is selected according to the requirements, the PIN number of these seats can be any one between 4PIN and 12PIN, and the PIN number of these seats can be different. In the specific implementation, the PIN number can also be other values, which are not limited here.

Preferably, the functional seat unit further comprises antenna seats connected to antennas, such as a first antenna seat 581 connected to a network antenna (WIFI/GPS/BT), a second antenna seat 582 connected to a main communication antenna (such as a 4G main antenna, which can be replaced with 5G, 6G, etc. in the future), and a third antenna seat 583 connected to an auxiliary communication antenna (such as a 4G auxiliary antenna). The first antenna seat 581 and the second antenna seat 582 are provided on the upper left side of the PCB board 10 (preferably, the first antenna seat 581 is located on the left side of the groove 80, and the second antenna seat 582 is located on the lower side of the first antenna seat 581), and the third antenna seat 583 is provided on the left side of the PCB board 10 (preferably, on the right side of the main microphone seat 45).

Preferably, the functional seat unit further comprises a motor seat 59 connected with a motor (for realizing the vibration of the electronic device). In this way, the educational tablet computers can interact with the user or prompt the operation through vibration during use.

In this embodiment, the holder seat 60 is a two-out-of-three holder seat, into which SIM cards and TF cards can be inserted. The position of the holder seat is preferably provided at the upper right end of the PCB board 10. As shown in FIG. 1, the second structural member 22 is fixed on the left side of the holder seat 60, and the third structural member 23 is fixed on the right side of the holder seat 60. In this way, the left and right sides of the holder seat 60 are shockproof and shakeproof by the structural members, which effectively protects the inserted card and prevents the card from moving or falling off after the shock of the PCB board 10. The battery seat 70 is a horizontal interface of a patch 5PIN compatible with three welding spots, and supports any PIN number between 5PIN and 12PIN. The height is 1.5 mm, which can meet the requirement of thinness.

In this embodiment, the PCB board is further provided with a Hall switch 90, which is located at the upper right corner of the PCB board 10. The Hall switch 90 outputs a signal to a wake-up circuit to light up the display screen for wake-up operation.

In this embodiment, the PCB board 10 has a length of 114 mm, a width of 66 mm and a thickness of 1 mm. All components are integrated on the front surface of the PCB board 10, so that the height of the front surface of a complete motherboard is limited to be 1.6 mm (that is, the overall height is 1.6 mm after each seat and each circuit are installed), and the height of the back surface of the PCB board 10 is limited to be 0.5 mm, which takes up little space on the back surface. By limiting the size of each seat and the PCB board, the motherboard can meet the requirements of thinning.

It should be understood that the positions of the above-mentioned seats can be adjusted according to the requirements (the positions of the front camera seat 31 and the rear camera seat 32 are preferably unchanged, otherwise, a longer signal line will be needed and the circuit layout will be affected), as long as the seats are provided on each side of the PCB board. The motherboard can also be applied to other electronic devices, such as tablet computers, mobile phones, billboards, display screens in elevators, publicity screens or queuing screens in hospitals, etc. The structures related to the shockproof, shakeproof and waterproof functions are applied to the PCB board of these electronic devices. The sizes of each interface and the PCB board meet the requirements of thinness, while the number of the interfaces and circuits on the PCB board can be increased or decreased and modified according to requirements, and the interfaces and circuits are not limited here. The motherboard can also be applied to MTK platforms, such as M211SR100 and M86PAR100. The name of the thin motherboard can be M211, U211, X211, which is not limited here.

Figure 3:
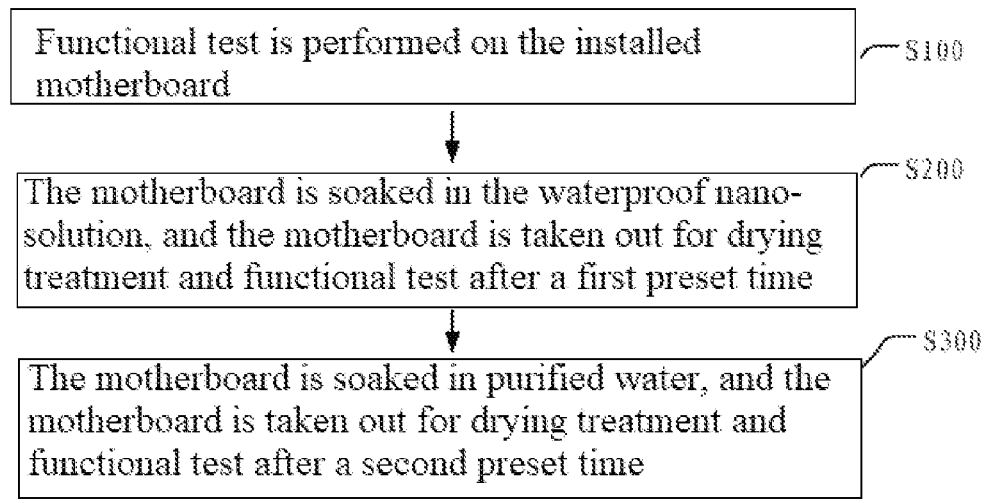
FIG. 3 is a flow chart of a waterproof preparation method of a motherboard with shockproof, shakeproof and waterproof functions according to the embodiment of the present disclosure.

Based on the above-mentioned motherboard with shockproof, shakeproof and waterproof functions, this embodiment further provides a waterproof preparation method of the motherboard with shockproof, shakeproof and waterproof functions. Referring to FIG. 3 together, the waterproof preparation method comprises the following steps.

S100, functional test is performed on the installed motherboard.

In this step, a plurality of structural members, the camera seat unit, the audio seat unit, the functional seat unit, the holder seat and the battery seat are installed on the PCB board, and various functional circuits are integrated on the PCB board to form the motherboard. After welding various components and seat interfaces, the function of the motherboard can be tested to ensure that all functions are normal after it is turned on. If there is any problem, the motherboard needs to be modified, and if there is no problem, the waterproof coating can be applied.

S200, the motherboard is soaked in the waterproof nano-solution, and the motherboard is taken out for drying treatment and functional test after a first preset time.

This step specifically comprises the following steps.

Step 210, the motherboard is placed into a container filled with waterproof nano-solution, and is taken out after being soaked for a first preset time.

The amount of the waterproof nano-solution should be able to completely submerge (soak) the motherboard. By using the whole soaking method, all components on the motherboard can be coated with waterproof coating, and the gaps can also be coated, so as to avoid the uneven problem caused by manual brushing or spraying. The motherboard is taken out after being soaked for a first preset time (such as 10 seconds). If the time is too long, there may be a risk of damaging the PCB board and the components thereon.

Step 220, the motherboard is placed into an oven for drying treatment, and then is installed and powered for functional test.

The motherboard with waterproof nano-solution is placed into an oven at about 100 degrees for drying treatment for preferably 10 minutes. After drying, a layer of waterproof coating with waterproof nano-material will be plated on the PCB board, on each component (the seat interface and the circuit components) and on the welding points of each component on the PCB board, so that the overall waterproof function of the motherboard can be realized. Thereafter, the dried motherboard is installed, and the functional test is carried out after being powered on to ensure that every functional test passes.

S300, the motherboard is soaked in purified water, and the motherboard is taken out for drying treatment and functional test after a second preset time.

In this step, the motherboard with normal functional test is soaked in a container filled with purified water, and the purified water completely submerges the motherboard. After a second preset time (such as 20 minutes), the motherboard is taken out and placed into an oven for drying, so as to ensure that the motherboard is completely dried, and then is installed and powered for power-on test. If it can be powered on normally and all functions are normal, it indicates that the waterproof nano-coating has played a protective role. If it cannot be powered on normally or can be powered on with some abnormal functions, it is necessary to confirm the reasons (such as the place where the waterproof coating is not coated well or the thickness is not enough), which can properly prevent from lengthening the duration of nano-solution cladding (soaking).

Through the above steps S100 to S300, the waterproof coating can be coated on a single motherboard and the functional test can be completed. The above steps can be repeated to perform batch processing on a plurality of motherboards.

According to the present disclosure, the tablet computer with shockproof, shakeproof and waterproof functions is waterproof not only in terms of the structure design, but also in terms of the hardware design, which fully ensures that the PCB circuit board and components on the PCB circuit board will not be damaged after the PCBA is soaked in water and other liquids.

To sum up, the motherboard with shockproof, shakeproof and waterproof functions, the electronic device and the waterproof preparation method provided by the present disclosure can prevent the motherboard from shifting or falling off when the electronic device drops by providing the structural member and the clamping slot to screw and fix the PCB board inside the cabinet, and protect the components on the PCB board against shock and shake, so as to avoid the damage of the components. After the test, the electronic device falls off for 10 times by 1 m, and there is no problem that the motherboard falls off or the components are damaged. Combined with the reinforcing bracket, the important USB interface is protected, and the USB interface does not fall off, deform and warp after dropping, and the screws do not fall off. At the same time, the waterproof coating is provided on the surface of the whole motherboard in a soaking manner, and the functional test is carried out, so that not only the seat structure is waterproof, but also the hardware circuit and all welding points are waterproof, which fully ensures that the motherboard will not damage the PCB board and the components on the board after being soaked in water and other liquids, and can also ensure the normal operation.

The above embodiments are only used to illustrate the technical solution of the present disclosure, rather than limit the technical solution. Although the present disclosure has been described in detail with reference to the foregoing embodiments, it should be understood by those skilled in the art that it is still possible to modify the technical solutions described in the foregoing embodiments, or to equivalently replace some technical features thereof; these modifications or substitutions do not make the essence of the corresponding technical solutions deviate from the spirit and scope of the technical solutions of various embodiments of the present disclosure.

The invention claimed is:

1. A motherboard with shockproof, shakeproof and waterproof functions, wherein the motherboard is installed in a cabinet of an electronic device, wherein the motherboard comprising a PCB board, wherein a front surface of the PCB board is provided with a plurality of structural members, a camera seat unit, an audio seat unit, a functional seat unit, a holder seat and a battery seat with shockproof and shakeproof functions; wherein each of the structural members is dispersedly fixed on a side of the PCB board, wherein each of the structural members screws and fixes the PCB board inside the cabinet, and wherein each of the seats and the PCB board are coated with waterproof coating; wherein each of the structural members further comprising a steel sheet and two supporting sheets for supporting the steel sheet, one end of the two supporting sheets is correspondingly fixed on both sides of the bottom of the steel sheet, another end of the two supporting sheets is provided with protruding feet, wherein the PCB board is provided with slots corresponding to the protruding feet, and the protruding feet of the two supporting sheets are inserted into the corresponding slots and welded to the PCB board; wherein a hollow structure is formed between the steel sheet, two support sheets, and the PCB board; wherein the middle of the steel sheet is provided with a first screw hole, the PCB board is provided with a second screw hole aligned with the first screw hole, the inner side of the cabinet is provided with a third screw hole aligned with the first screw hole, and each of the structural members' screws pass through the first screw hole and the second screw hole in sequence and are disposed in the third screw hole.

2. The motherboard with shockproof, shakeproof and waterproof functions according to claim 1, wherein the side of the PCB board is further provided with a plurality of clamping slots, wherein the inner side of the cabinet is provided with clamping posts corresponding to the clamping slots, and wherein the clamping slots are clamped on the clamping posts.

3. The motherboard with shockproof, shakeproof and waterproof functions according to claim 1, wherein the camera unit further comprising a front camera seat and a rear camera seat, wherein the front camera seat is provided at the lower left corner of the PCB board, and the rear camera seat is provided at the left side of the PCB board; and wherein a middle of an upper side of the PCB board is provided with a groove for accommodating a camera.

4. The motherboard with shockproof, shakeproof and waterproof functions according to claim 1, wherein the audio seat unit further comprising a first speaker seat, a second speaker seat, a third speaker seat, a fourth speaker seat, a main microphone seat and an auxiliary microphone seat; wherein the first speaker seat, the second speaker seat, the main microphone seat and the auxiliary microphone seat are provided on left side of the PCB board; wherein the third speaker seat and the fourth speaker seat are provided on right side of the PCB board.

5. The motherboard with shockproof, shakeproof and waterproof functions according to claim 3, wherein the functional seat unit further comprising a USB interface for connecting a USB device, a key seat for connecting function keys, an electromagnetic screen seat for connecting an electromagnetic screen, a screen seat for connecting a display screen, a keyboard seat for connecting a keyboard externally, and an antenna seat for connecting an antenna;

wherein the USB interface is provided on right side of the groove, the key seat is provided on left side of the PCB board, and the electromagnetic screen seat, the screen seat and the keyboard seat are provided on lower side of the PCB board; the antenna seat is provided on left side of the PCB board.

6. The motherboard with shockproof, shakeproof and waterproof functions according to claim 5, further comprising a reinforcing bracket, wherein the reinforcing bracket covers upper side, left side and right sides of the USB interface, wherein the left side and right side of the reinforcing bracket are provided with a structural member, respectively, wherein the supporting legs on the left side and right side of the reinforcing bracket are welded to the PCB board, and wherein sides of the supporting legs are connected with the steel sheets corresponding to the structural members.

7. The motherboard with shockproof, shakeproof and waterproof functions according to claim 3, wherein the holder seat is provided at the upper right end of the PCB board, and the left side and right side of the holder seat are provided with a structural member, respectively; and wherein the battery seat is a horizontal interface of a patch 5PIN.

8. An electronic device, comprising a cabinet, wherein the motherboard with shockproof, shakeproof and waterproof functions according to claim 1 is installed in the cabinet.

9. A waterproof preparation method of the motherboard with shockproof, shakeproof and waterproof functions according to claim 1, comprising: Step A, performing a functional test on the installed motherboard; Step B, soaking the motherboard in the waterproof nano-solution, and taking the motherboard out for a drying treatment and a functional test after a first predetermined time; Step C, soaking the motherboard in purified water, taking the motherboard out for a drying treatment and a functional test after a second predetermined time.

* * * * *